(12) United States Patent
Depetro et al.

(10) Patent No.: US 6,587,326 B2
(45) Date of Patent: Jul. 1, 2003

(54) HIGH-Q, VARIABLE CAPACITANCE CAPACITOR

(75) Inventors: Riccardo Depetro, Domodossola (IT); Stefano Manzini, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/251,630

(22) Filed: Sep. 19, 2002

(65) Prior Publication Data

US 2003/0072123 A1 Apr. 17, 2003

(30) Foreign Application Priority Data

Sep. 20, 2001 (EP) .............................................. 01830595

(51) Int. Cl.[7] ................................................. H01G 5/00
(52) U.S. Cl. ....................................... 361/277; 257/532
(58) Field of Search .......................... 361/277, 290, 361/278, 298.2, 298.4; 257/522, 534, 312

(56) References Cited

U.S. PATENT DOCUMENTS

| | | | |
|---|---|---|---|
| 4,929,989 A | 5/1990 | Hayano | 357/23.6 |
| 5,656,834 A | 8/1997 | Grzyb et al. | 257/207 |
| 6,396,677 B1 * | 5/2002 | Chua et al. | 361/278 |
| 6,441,449 B1 * | 8/2002 | Xu et al. | 257/414 |

* cited by examiner

Primary Examiner—Anthony Dinkins
(74) Attorney, Agent, or Firm—Lisa K. Jorgenson; Robert Iannucci; Seed IP Law Group PLLC

(57) ABSTRACT

High-Q, variable capacitance capacitor is formed by including a pocket of semiconductor material; a field insulating layer, covering the pocket; an opening in the field insulating layer, delimiting a first active area; an access region formed in the active area and extending at a distance from a first edge of the active area and adjacent to a second edge of the active area. A portion of the pocket is positioned between the access region and the first edge and forms a first plate; an insulating region extends above the portion of said body, and a polysilicon region extends above the insulating region and forms a second plate. A portion of the polysilicon region extends above the field insulating layer, parallel to the access region; a plurality of contacts are formed at a mutual distance along the portion of the polysilicon region extending above the field insulating layer.

15 Claims, 2 Drawing Sheets

HIGH-Q, VARIABLE CAPACITANCE CAPACITOR

BACKGROUND OF THE INVENTION

1. Field of the Invention

The present invention relates to a high-Q, variable capacitance capacitor (varactor).

2. Description of the Related Art

As is known, one of the problems in manufacturing a varactor is how to obtain a high value of the quality factor Q.

For a better understanding of the problem underlying the present invention, the structure of a known varactor and the dependence of the quality factor Q on the geometry and on the project parameters will now be described.

In FIG. 1, a varactor 1 of a known type, with an MOS structure, is formed in a pocket 2 of $N^-$-type silicon. A field oxide layer 3 has an opening delimiting an active area 4 accommodating two access regions 5, of $N^+$-type, mutually distanced by a portion 6 of the pocket 2, forming a first plate of the varactor. A thin dielectric layer 10 (typically silicon oxide), forming the dielectric of the varactor, is present above the portion 6 of the pocket 2; a polysilicon strip 11 extends above the thin dielectric layer 10 and forms a second plate of the varactor.

The polysilicon strip 11 extends for the whole width of the active area 4 (in direction z, like the access regions 5) and also continues above the field oxide layer 3, where a metal contact 12 is formed for electrical connection to an upper metal interconnecting line, not shown.

The access regions 5 are electrically contacted through contacts not shown.

In the structure of FIG. 1, the access regions 5 form silicon access resistances $R_{si}$ and the polysilicon strip 11 forms a polysilicon access resistance $R_{poly}$; the sum of the two resistances forms the series resistance R of the varactor 1.

For the varactor 1 the quality factor Q is given by:

$$Q = \frac{\text{Re}(Z)}{\text{Im}(Z)} = \frac{1}{\omega RC} = \frac{1}{\omega C_{ox}(R_{si} + R_{poly})} \quad (1)$$

$$= \frac{1}{\omega C_{ox}\left(\alpha\rho_{si}\frac{L}{W}WL + \beta\rho_{poly}\frac{W}{L}WL\right)} =$$

$$= \frac{1}{\omega C_{ox}(\alpha\rho_{si}L^2 + \beta\rho_{poly}W^2)}$$

wherein $C_{ox}$ is the capacitance of the thin dielectric layer 10, $\alpha$ and $\beta$ are experimental coefficients, dependent upon the technology, L and W are respectively the length and the width of the polysilicon strip 11 and $\rho_{si}$ and $\rho_{poly}$ are the sheet resistances of the pocket 2 and of the polysilicon strip 11.

In (1), the importance of the value of the series resistance R may be clearly seen: the lower this resistance, the higher the value of Q that may be obtained at a given frequency.

In the structure of FIG. 1, the silicon access resistance $R_{si}$ may be minimized using a strongly doped layer ($N^+$, for example), autoaligned to the edge of the polysilicon strip 11 and using sufficiently small lengths L.

On the other hand, using small lengths L means having a high polysilicon access resistance $R_{poly}$; normally this resistance is minimized in advanced-type processes by using metal suicides on the gate. This approach, however, imposes restraints as far as regards the maximum length (W) of the structures.

BRIEF SUMMARY OF THE INVENTION

Embodiments of the present invention provide a high-Q, variable capacitance capacitor.

According to one embodiment, the structure is no longer similar to an MOS transistor, but the polysilicon region formed on a thin oxide layer is sided by a portion formed on a thick oxide layer; on the latter portion a contact is formed to allow displacement current to follow a minimum path within a metal line having a low resistivity (for example, of aluminum or tungsten). In this way it is possible to form a structure with a reduced length L and at the same time minimize the polysilicon access resistance $R_{poly}$.

BRIEF DESCRIPTION OF THE SEVERAL VIEWS OF THE DRAWING(S)

For an understanding of the present invention, some preferred embodiments are now described, purely as an example without limitation, with reference to the enclosed drawings, wherein.

DETAILED DESCRIPTION OF THE INVENTION

Figure 2:
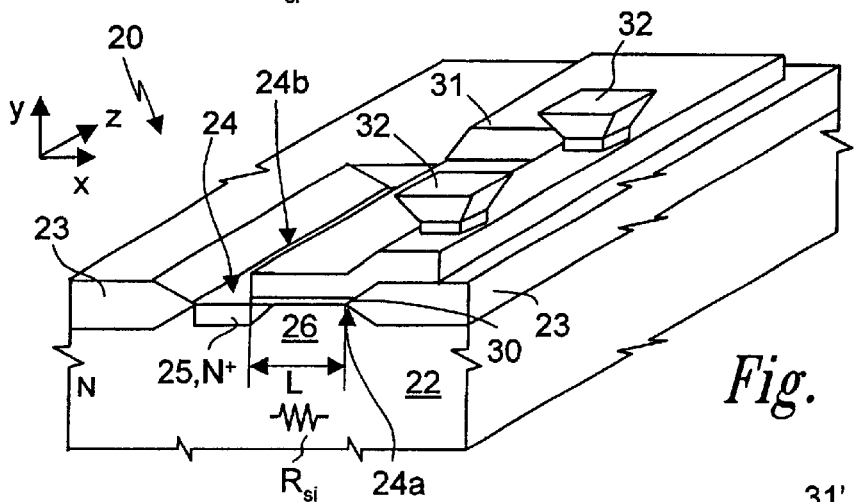
FIG. 2 shows a sectional perspective view of a first embodiment of a varactor according to the invention.

In FIG. 2, a varactor 20 is formed in a pocket 22 of $N^-$-type silicon. A field oxide layer 23 has an opening delimiting an active area 24 accommodating a single access region 25, of $N^+$-type. The access region 25 extends at a predetermined and constant distance L from a first edge 24a of the active area 24 (that is from the field oxide layer 23) and adjacent to a second edge 24a, opposite the first edge 24a, of the active area 24 for the whole width of the active area 24 in direction z. A portion 26 of the pocket 22 is comprised between the access region 25 and the first edge 24a of the active area 24 and forms a first plate of the varactor 20. A thin dielectric layer 30 (typically silicon oxide), forming the dielectric of the varactor, extends above the portion 26 of the pocket 22; a polysilicon strip 31 extends above the thin dielectric layer 30, forming a second plate of the varactor.

The polysilicon strip 31 extends in direction z for the whole width of the active area 24 and continues above the field oxide layer 23; moreover, in direction x, the polysilicon strip 31 extends in length beyond the first edge 24a of the active area 24, above the latter, where a plurality of metal contacts 32 is formed (only two of which are shown in FIG. 2). The contacts 32 contact and extend upwardly from the polysilicon strip 31 for electrical connection to an upper metal interconnecting line (for example, aluminum or tungsten), not shown.

On the edge opposite the one extending above the field oxide layer 23 (in FIG. 2, on the left edge), the polysilicon strip 31 is auto-aligned with the access region 25.

Here too, the access regions 25 are electrically contacted through contacts not shown.

Forming the contacts of the polysilicon strip 31 on its whole width (in direction z), at a short distance from each other (for example at 1.2 μm for a 1 μm technology, or up to 0.2 μm for a 0.18 μm technology), the current path between the low-resistance interconnecting line, formed at an upper level and not shown, and the second plate of the varactor 20, is minimized.

Figure 1:
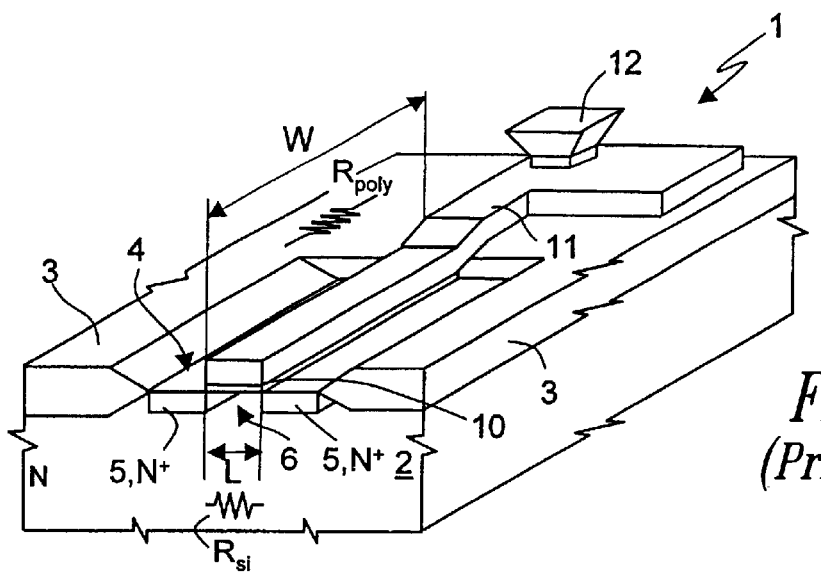
FIG. 1 shows a sectional perspective view of a varactor of a known type.
Figure 4:
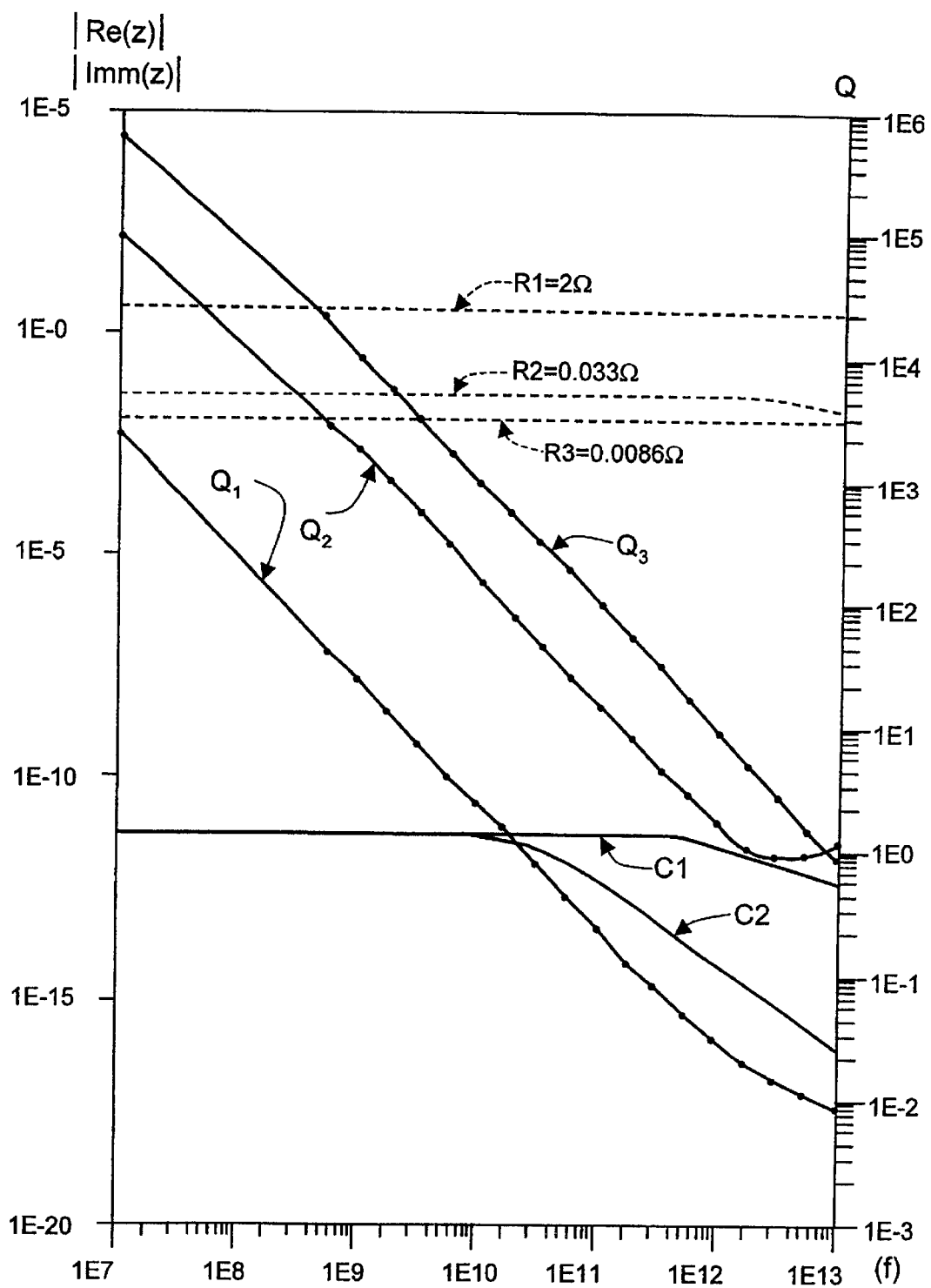
FIG. 4 shows the plot of some quantities referred to the known varactor in FIG. 1 and to the varactor according to the invention as in FIG. 2.

Thereby the value of Q is considerably increased, as shown in FIG. 4, wherein R1 and Q1 indicate the series resistance and the quality factor of the known varactor 1 of FIG. 1; R2 and Q2 indicate the series resistance and the quality factor of the varactor 20 of FIG. 2; R3 and Q3 indicate the series resistance and the quality factor that can be obtained by directly contacting the entire polysilicon strip 31 and heavily doping the pocket 22 (obtainable with a test sample so as to assess the performances in limit condition); and C1, C2 indicate the capacitance respectively of the known varactor 1 and of the varactor 20 of FIG. 2.

From this simulation it may be seen that the value of Q at a frequency of 1 GHz passes from 10–20 in the case of the known varactor 1 to 300–350 GHz in the case of the varactor 20 of FIG. 2.

The structure in FIG. 2 moreover affords the advantage that a technology with very extreme minimum lithography is not required, since the length L derives from the intersection between the first edge 24a of the active area 24 and the edge of the access region 25 and thus it is independent of the minimum lithographic dimensions available.

Figure 3:
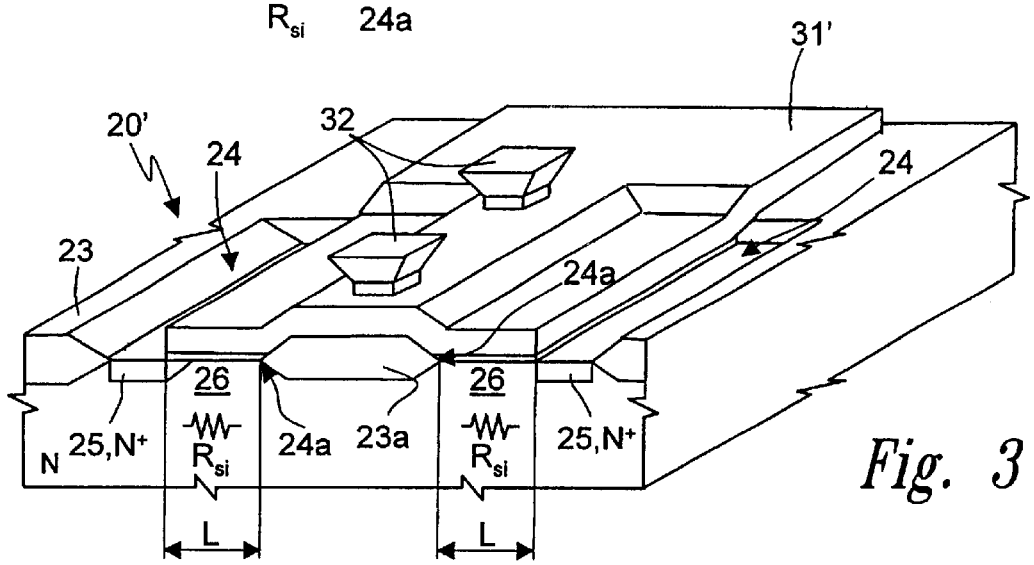
FIG. 3 shows a sectional perspective view of a second embodiment of a varactor according to the invention.

FIG. 3 shows a different embodiment of the varactor according to the invention, having a symmetrical structure with respect to a vertical plane parallel to the z axis. In detail, in the varactor 20 of FIG. 3 two active areas 24 are formed, each housing a respective access region 25. An oxide portion 23a of the field oxide layer 23 separates the two active areas 24 and each access region 25 is distanced from the oxide portion 23a by a respective portion 26 of the pocket 22 having length L. A thin dielectric layer 30 extends above a respective portion 26 of the pocket 22. A polysilicon strip 31' extends uninterruptedly above the two thin dielectric layers 30 as well as above the oxide portion 23a which separates them and thus forms a first and a third plate facing a second and a fourth plate formed by the two portions 26 of the pocket 22; the contacts 32 are formed on the mid line of the polysilicon strip 31', above the oxide portion 23a.

In the varactor 20' of FIG. 3 a greater repeatability of the value of Q is obtained. In fact, the varactor is formed by connecting in parallel two capacitors, one on the left and the other on the right of the oxide portion 23 and is therefore equivalent to a capacitor having plates (upper and lower) with length 2L equal to the sum of the length L of the two portions 26 of the pocket 22; moreover any imprecision in the mask alignment which might cause an error ±ΔL in the left capacitor would produce an opposite error in the right capacitor and would therefore be compensated.

Finally it is clear that numerous modifications and variations may be made to the varactor described and illustrated, all falling within the scope of the invention, as defined in the enclosed claims.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

What is claimed is:

1. A high-Q, variable capacitance capacitor, comprising:
a body of semiconductor material;
a field insulating layer, covering said body of semiconductor material;
a first opening in said field insulating layer delimiting a first active area;
a first access region formed in said first active area and extending at a distance from a first edge of said first active area;
a first portion of said body being comprised between said first access region and said first edge and forming a first plate;
a first insulating region, extending above said first portion of said body;
a polycrystalline region, of polycrystalline semiconductor material, extending above said first insulating region and forming a second plate; and
a plurality of contacts extending at a distance from each other along said polycrystalline region.

2. A capacitor according to claim 1, wherein said polycrystalline region further comprises a polycrystalline portion extending above said field insulating layer, along said first edge of said first active area and said contacts are formed above said polycrystalline portion.

3. A capacitor according to claim 1 wherein said first portion of said body is delimited by said field insulating layer along said first edge of said first active area.

4. A capacitor according to claim 1, wherein said first access region and said polycrystalline region have a mutually aligned edge.

5. A capacitor according to claim 1, wherein said first access region extends along and is adjacent to a second edge of said first active area, opposite said first edge of said first active area.

6. A capacitor according to claim 1, further comprising:
a second opening in said field insulating layer delimiting a second active area;
a second access region formed in said second active area and extending at a distance from a first edge of said second active area;
a second portion of said body positioned between said second access region and said first edge of said second active area forming a third plate; and
a second insulating region, extending above said second portion of said body, said polycrystalline region extending above said second insulating region and forming a fourth plate, and said contacts being arranged in a symmetrical position with respect to said first and second portions of said body.

7. A capacitor according to claim 6, wherein said second active area, said second access region, said second portion of said body and said second insulating region are arranged symmetrically with respect to said first active area, said first access region, said first portion of said body and said first insulating region.

8. A capacitor according to claim 6, wherein said body has a conductivity type and a first doping level and said first and second access regions have said conductivity type and a second doping level, higher than said first doping level.

9. A high-Q, variable capacitance capacitor, comprising:
a semiconductor body;
a first insulating region extending above a first portion of said body;
a first polycrystalline region, of polycrystalline semiconductor material, extending above said first insulating region and forming a first plate; and
a plurality of contacts extending at a distance from each other along said polycrystalline region.

10. A capacitor according to claim 9, further comprising a field insulating layer covering a body of semiconductor material, wherein said polycrystalline region further comprises a polycrystalline portion extending above said field insulating layer, and said contacts are formed above said polycrystalline portion.

11. A capacitor according to claim 10, further comprising:
a second insulating region extending above a second portion of said body;
a second polycrystalline region extending above said second insulating region and forming a second plate, and said contacts being arranged in a symmetrical position with respect to said first and second portions of said body.

12. A high-Q, variable capacitance capacitor, comprising:
a body of semiconductor material;
a first active area;
a first access region formed in said first active area and extending at a distance from a first edge of said first active area;
a first portion of said body being positioned between said first access region and said first edge and forming a first plate;
a first insulating region, extending above said first portion of said body;
a polycrystalline region extending above said first insulating region and forming a second plate; and
a plurality of contacts extending at a distance from each other along said polycrystalline region.

13. A capacitor according to claim 12, wherein said polycrystalline region further comprises a polycrystalline portion extending above said field insulating region, along said first edge of said first active area and said contacts are formed above said polycrystalline portion.

14. A capacitor according to claim 12, further comprising:
a second active area;
a second access region formed in said second active area and extending at a distance from a first edge of said second active area;
a second portion of said body positioned between said second access region and said first edge of said second active area forming a third plate; and
a second insulating region, extending above said second portion of said body, said polycrystalline region extending above said second insulating region and forming a fourth plate, and said contacts being arranged in a symmetrical position with respect to said first and second portions of said body.

15. A capacitor according to claim 14, wherein said second active area, said second access region, said second portion of said body and said second insulating region are arranged symmetrically with respect to said first active area, said first access region, said first portion of said body and said first insulating region.

* * * * *